United States Patent
Wang et al.

(10) Patent No.: US 10,859,924 B2
(45) Date of Patent: Dec. 8, 2020

(54) METHOD FOR MANUFACTURING SEMICONDUCTOR DEVICE AND SYSTEM FOR PERFORMING THE SAME

(71) Applicant: TAIWAN SEMICONDUCTOR MANUFACTURING CO., LTD., Hsinchu (TW)

(72) Inventors: Wen-Yun Wang, Taipei (TW); Hua-Tai Lin, Hsinchu (TW); Chia-Chu Liu, Shin-chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 271 days.

(21) Appl. No.: 15/965,251

(22) Filed: Apr. 27, 2018

(65) Prior Publication Data

US 2019/0146357 A1 May 16, 2019

Related U.S. Application Data

(60) Provisional application No. 62/586,689, filed on Nov. 15, 2017.

(51) Int. Cl.
*G03F 7/20* (2006.01)
*G03F 9/00* (2006.01)

(52) U.S. Cl.
CPC ........ *G03F 7/70633* (2013.01); *G03F 7/2022* (2013.01); *G03F 7/705* (2013.01); *G03F 9/7003* (2013.01)

(58) Field of Classification Search
CPC .... G03F 7/2022; G03F 7/705; G03F 7/70633; G03F 9/7003
USPC ............................................. 430/22, 30, 312
See application file for complete search history.

(56) References Cited

U.S. PATENT DOCUMENTS

| | | | |
|---|---|---|---|
| 8,675,180 | B2 | 3/2014 | Ahn et al. |
| 8,703,368 | B2 | 4/2014 | Lee et al. |
| 8,837,810 | B2 | 9/2014 | Chen et al. |
| 9,360,778 | B2 | 6/2016 | Chen et al. |
| 9,442,392 | B2 | 9/2016 | Tsen et al. |
| 9,490,181 | B2 | 11/2016 | Chung |
| 2015/0015870 | A1 | 1/2015 | Lin et al. |
| 2016/0062250 | A1 | 3/2016 | Hung et al. |
| 2017/0017166 | A1 | 1/2017 | Lee et al. |

*Primary Examiner* — Christopher G Young
(74) *Attorney, Agent, or Firm* — McDermott Will & Emery LLP

(57) ABSTRACT

A method for manufacturing a structure on a substrate includes projecting an image of a reference pattern onto a substrate having a first patterned layer, the first patterned layer including first alignment marks and first overlay measurement marks, and the reference pattern including second alignment marks and second overlay measurement marks, aligning, based on the first alignment marks and the second alignment marks, the first patterned layer to the image of the reference pattern, obtaining a pre-overlay mapping of the first overlay measurement marks and the second overlay measurement marks, and determining compensation data indicative of information of the pre-overlay mapping of the first overlay measurement marks and the second overlay measurement marks.

20 Claims, 12 Drawing Sheets

US 10,859,924 B2

METHOD FOR MANUFACTURING SEMICONDUCTOR DEVICE AND SYSTEM FOR PERFORMING THE SAME

CROSS REFERENCE TO RELATED APPLICATION

This application claims priority to U.S. Provisional Application No. 62/586,689 filed Nov. 15, 2017, entitled "METHOD FOR MANUFACTURING SEMICONDUCTOR DEVICE AND SYSTEM FOR PERFORMING THE SAME," the entire disclosure of which is incorporated herein by reference.

BACKGROUND

As the semiconductor technology advances, more complex circuits/structures having smaller sizes have been integrated to a semiconductor device. In the course of semiconductor device evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also increased the complexity of manufacturing processes. For example, the overlay errors induced in lithography patterning are challenging to be reduced along with advanced lithography technologies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIG. 1 shows a cross-sectional view of a portion of a substrate having a fabricated structure, based on which a semiconductor device is manufactured by a method according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Although operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently.

FIG. 1 shows a cross-sectional view of a portion of a substrate having a fabricated structure, based on which a semiconductor device is manufactured by a method according to some embodiments.

As shown in FIG. 1, a substrate W has a fabricated structure including a first patterned layer 101. The first patterned layer 101 is formed in a first material layer and includes first patterns including, but not limited to, a first major pattern 61A, a set of first alignment marks 62A including a first coarse alignment mark 63A and a first fine alignment mark 64A for alignment, and first overlay measurement marks 65A for pre-overlay measurement and overlay measurement. The substrate W can be a semiconductor substrate formed of, for example, one of Si, Ge, SiGe, SiC, SP, SiPC, InP, InAs, GaAs, AlInAs, InGaP, InGaAs, GaAsSb, GaPN, AlPN, and any other suitable material.

The first pattern 61A constructs one of a plurality of layers of an integrated circuit of a semiconductor device to be manufactured on the substrate W. The first material layer, based on which the first patterned layer 101 is made, can include a semiconductor material layer (such as a silicon layer, a germanium layer, or a silicon germanium layer), a dielectric material (such as an interlayer dielectric), or a conductive material (such as a metal layer or a doped polysilicon layer) in embodiments. The first material layer is patterned to form the first patterned layer 101 by a suitable technology (such as a lithography process, followed by an etching process with a patterned photoresist as an etching mask to remove portions of the first material layer exposed by the lithography process). In various embodiments, the first major pattern 61A of the first patterned layer 101 includes a doping pattern (such as various source and drain features formed in a semiconductor material layer), a gate electrode pattern (having multiple gate electrodes of polysilicon or metal), or an interconnect pattern having a plurality of conductive features (such as contacts, vias, or metal lines).

Although only one set of the first alignment marks 62A is depicted in FIG. 1, the present disclosure is not limited thereto. For example, the number of sets of the alignment marks 62A can be two or more and be designed to have sufficient coverage of the substrate from field to field and/or from chip to chip to allow an alignment tool to effectively perform alignment. In some embodiments, the first alignment marks 62A, including the first coarse alignment marks 63A and the first fine alignment marks 64A in the first patterned layer 101, are formed on regions of the substrate W on which chips are formed, and/or are formed on scribe lanes/scribe lines which will be cut by a dicing saw to singulate the chips formed on the substrate W. The locations of the first alignment marks 62A are not limited and can be modified dependent on design particulars.

According to some embodiments, each coarse alignment mark 63A occupies an area, for example, between about 100 µm×100 µm to about 1000 µm×1000 µm. An alignment tool can locate and identify the first coarse alignment marks 63A from various patterns in the first patterned layer 101 and second coarse alignment marks in a photomask corresponding to the first coarse alignment marks 63A, so as to align the photomask to the first patterned layer 101. In some embodiments, the alignment tool, capable to capture an image having a size of about 40 µm×40 µm to about 50 µm×50 µm under a coarse alignment mode, can make alignment with an alignment accuracy of about 250 nm based on the first coarse alignment marks 63A in the first patterned layer 101 and the second coarse alignment marks in the photomask.

Here, the alignment (or overlay) accuracy refers to an alignment (or overlay) error, an alignment (or overlay) margin, an alignment (or overlay) tolerance, or a misalignment. These terms are exchangeable in some embodiments. In a case in which N nm (N is a number) is used to describe a range of one of these terms, patterns of one layer that intend to have an ideal or perfect alignment with patterns of another layer have N nm or less offset from each other.

The alignment accuracy of 250 nm by the coarse alignment may not be suitable to manufacture integrated circuits. According to some embodiments, the alignment tool can use the fine alignment marks 64A each occupying an area, for example, about 30 µm×50 µm to about 140 µm×250 µm, to further improve alignment accuracy. For example, the alignment tool, capable to capture an image having a size of about 1 µm×1 µm to about 50 µm×50 µm under a fine alignment mode, can make alignment with an alignment accuracy of about 20 nm or less based on the first fine alignment marks 64A in the first patterned layer 101 and second fine alignment marks in the photomask corresponding to the first fine alignment marks 64A.

However, the alignment accuracy of 20 nm by the fine alignment may still not be suitable to manufacture integrated circuits when the critical dimension (CD) becomes smaller and smaller. The alignment accuracy of 20 nm can be further improved by a series of processes shown in FIG. 2.

Figure 2:
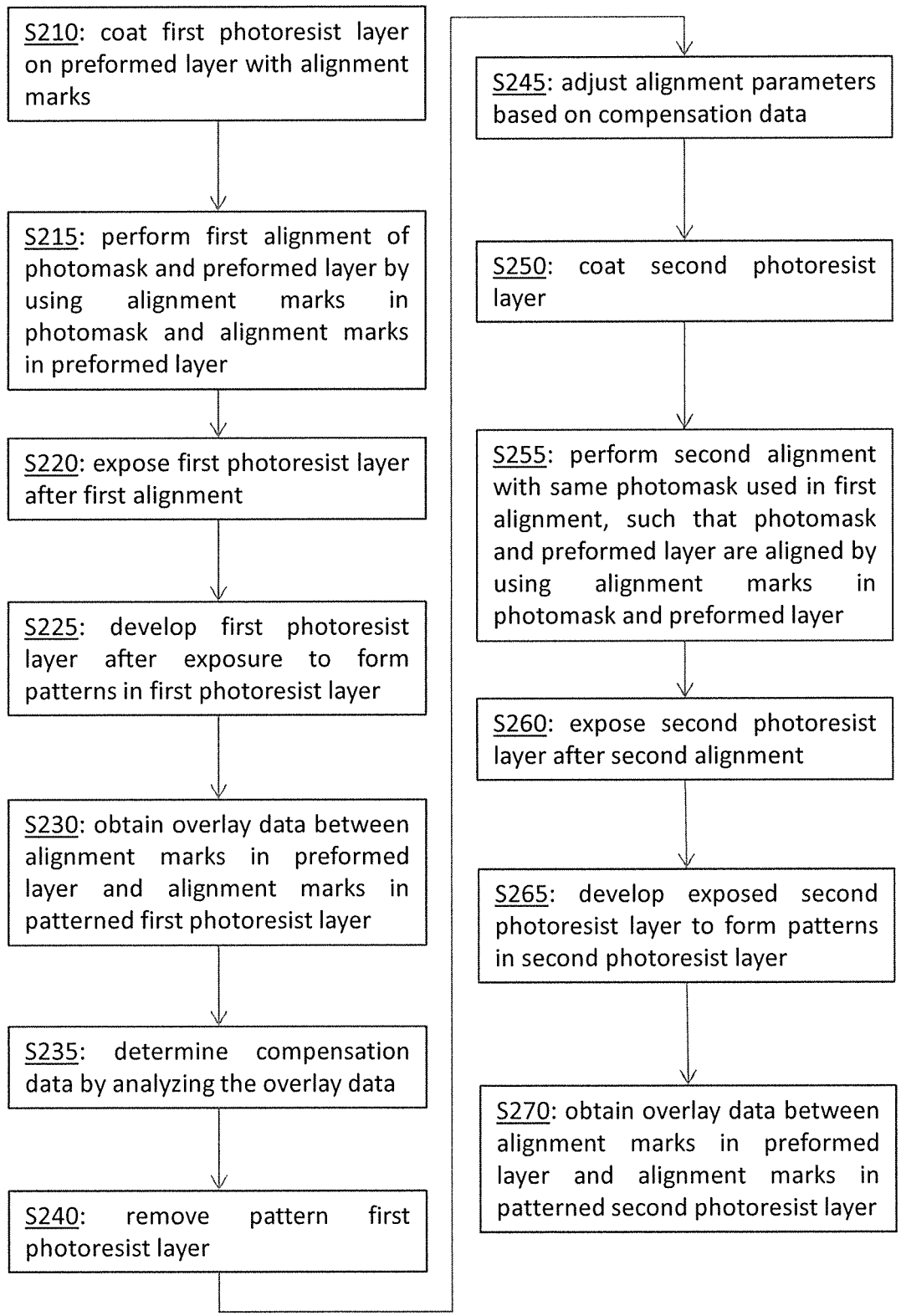
FIG. 2 shows a process flowchart to improve an alignment accuracy during manufacturing a semiconductor device.

Referring to FIG. 2, the series of processes to further improve the alignment accuracy can include: coating a first photoresist layer on a fabricated layer with alignment marks (S210); perform a first alignment, by an alignment tool, to align a photomask to the fabricated layer by using coarse and fine alignment marks in the photomask and coarse and fine alignment marks in the fabricated layer (S215); exposing a first photoresist layer after the first alignment (S220); developing the exposed first photoresist layer to form patterns in the first photoresist layer (S225); obtaining, by an overlay measurement metrology tool, overlay data between the coarse and/or fine alignment marks in the fabricated layer and the coarse and/or fine alignment marks in the patterned first photoresist layer (S230); determining compensation data including one or more parameters to be used in a subsequent alignment operation to eliminate or reduce the overlay errors, by analyzing the overlay data (S235); removing the patterned first photoresist layer (S240); adjusting alignment parameters of the alignment tool based on the compensation data (S245); coating a second photoresist layer (S250); perform a second alignment with the same photomask used in the first alignment to align the photomask to the fabricated layer by using the coarse and fine alignment marks in the mask and the fabricated layer (S255); exposing the second photoresist layer after the second alignment (S260); developing the exposed second photoresist layer to form patterns in the second photoresist layer (S265); and obtaining, by the overlay measurement metrology tool, overlay data between the alignment marks in the fabricated layer and alignment marks in the patterned second photoresist layer (S270). The steps 235-270 can be omitted if the measured overlay data in the step 230 indicate the first photoresist layer and the fabricated layer 101 aligned with each other having an offset within a predetermined range.

In some embodiments, the series of processes use an overlay measurement metrology tool to obtain the overlay data of the patterned first photoresist layer and the fabricated layer, so as to determine the compensation data used to adjust one or more alignment parameters to improve the subsequent alignment between the photomask to the fabricated layer prior to exposing the second photoresist layer. The series of processes are time consuming and expensive, due to at least the processes or the measurement performed to the first photoresist layer, patterns of which, however, are not used to be transferred to an underlining layer such as a second material layer 102 shown in FIG. 1.

Referring back to FIG. 1, according to some embodiments, the first patterned layer 101 further includes the first overlay measurement marks 65A for pre-overlay measurement and/or overlay measurement.

In some embodiments, a pre-overlay measurement or metrology refers to a measurement or metrology performed to overlay measurement marks in an alignment model (e.g., overlay measurement marks of a virtual mask to be described later), with respect to overlay measurement marks in a fabricated layer, and an overlay measurement or metrology or a post-overlay measurement or metrology refers to a measurement or metrology performed to overlay measurement marks in a later patterned layer such as a photoresist layer, with respect to overlay measurement marks in the fabricated layer.

In some embodiments, the pre-overlay measurement or metrology can be performed after performing virtual alignment (will be described later) but prior to coating a photoresist layer, or after coating a photoresist layer and performing virtual alignment but before exposing the coated photoresist layer. In some embodiments, the overlay measurement or metrology can be performed after aligning a real mask to the fabricated layer and exposing and developing the coated photoresist layer.

As to the locations of the first overlay measurement marks 65A, the first overlay measurement marks 65A of the first patterned layer 101 can be formed on regions of the substrate W on which chips are formed, and/or formed on scribe lanes/scribe lines which will be cut by a dicing saw to singulate the chips formed on the substrate W according to some embodiments. In some embodiments, the first overlay measurement marks 65A can have a size smaller than the first fine alignment marks 64A, such that a smaller region is used to implement one first overlay measurement mark 65A, as compared to an example in which a fine alignment mark 64A is used as an overlay measurement mark. Accordingly, for limited regions available to implement overlay measurement marks in the substrate W, more first overlay measurement marks 65A can be implemented, thereby having more overlay data so as to improve reliability or accuracy of the pre-overlay measurement and/or overlay measurement. The present disclosure should not be limited thereto. In some embodiments, the first overlay measurement marks 65A can have a size equal to or greater than the first fine alignment marks 64A.

According to some embodiments, the first overlay measurement marks 65A can be evenly or randomly distributed across the substrate W, such that the overlay data can be sufficiently represent overall overlay measurement to improve reliability or accuracy of the pre-overlay measurement and/or overlay measurement.

In some embodiments, the first overlay measurement marks 65A can be distributed with a higher density in a first region of the substrate W than a second region of the substrate W, in case in which the first region is a point of interest where critical semiconductor devices are located and the second region where fewer critical semiconductor devices such as dummy devices are located. As such, the first region as a point of interest can have a higher reliability or accuracy of the pre-overlay measurement and/or overlay measurement, as compared to the second region. The present disclosure should not be limited thereto. In some embodiments, the first overlay measurement marks 65A can be located on regions acting as dummy/testing regions so as not to occupy or waste regions in the substrate W for manufacturing real semiconductor devices.

In some embodiments, a critical dimension (CD) of the first overlay measurement marks 65A can be equal to, or close to of a critical dimension (CD) of the first major pattern 61A (e.g., within 80-120% of the CD of the first major pattern 61A), such that the overlay data can represent overall overlay data of the first major pattern 61A.

Regardless of where the first overlay measurement marks 65A are located in the substrate W, once a reference position of the substrate W or the first patterned layer 101 is identified by a pre-overlay measurement tool or an overlay measurement tool, the pre-overlay measurement tool or the overlay measurement tool, which stores location information of the entire first overlay measurement marks 65A based on output from a mask design tool (i.e. one or more computer implemented with electronic design automation (EAD) software/tool), can identify the entire first overlay measurement marks 65A.

Figure 3A:
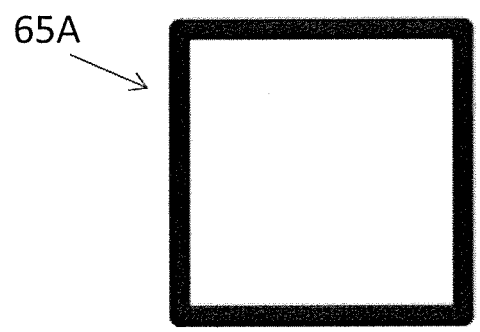
FIGS. 3A, 3B, and 3C show various examples of a first overlay measurement mark in a first patterned layer on a substrate, according to some embodiments.
Figure 3B:
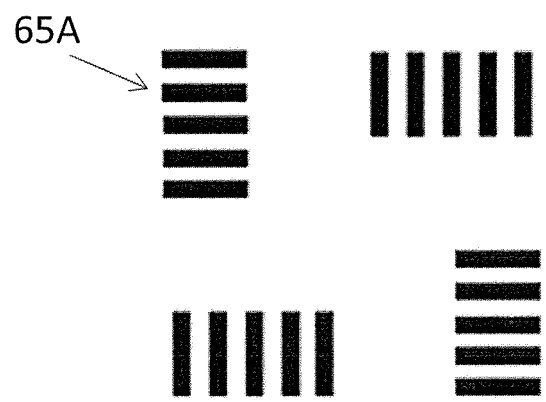
Figure 3C:
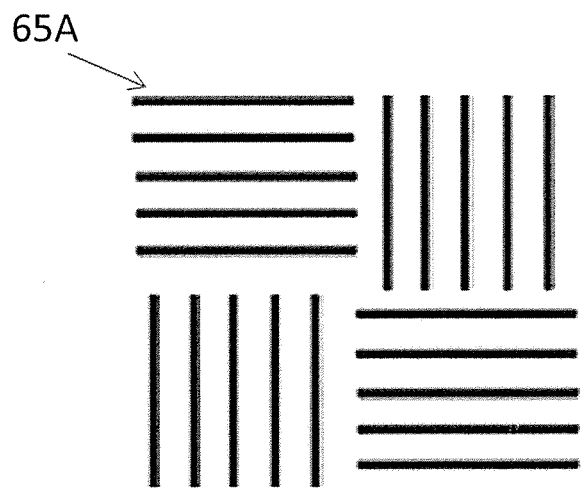
Figure 4A:
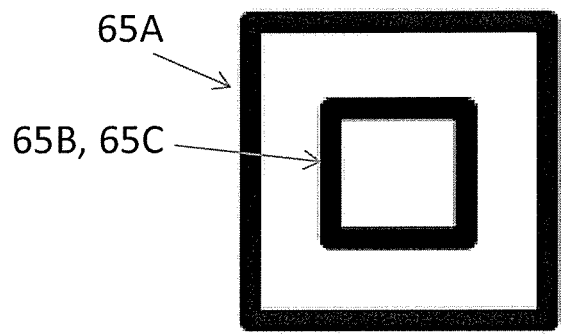
FIGS. 4A, 4B, and 4C show various examples of a first overlay measurement mark overlaying a second overlay measurement mark of an alignment model or a third overlay measurement mark of a patterned photoresist layer, during manufacturing a semiconductor device according to some embodiments.
Figure 4B:
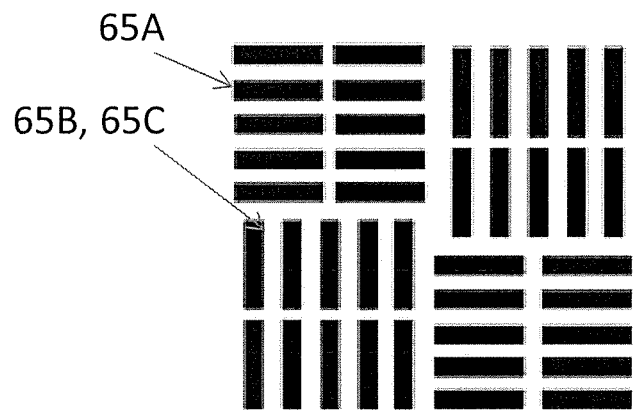
Figure 4C:
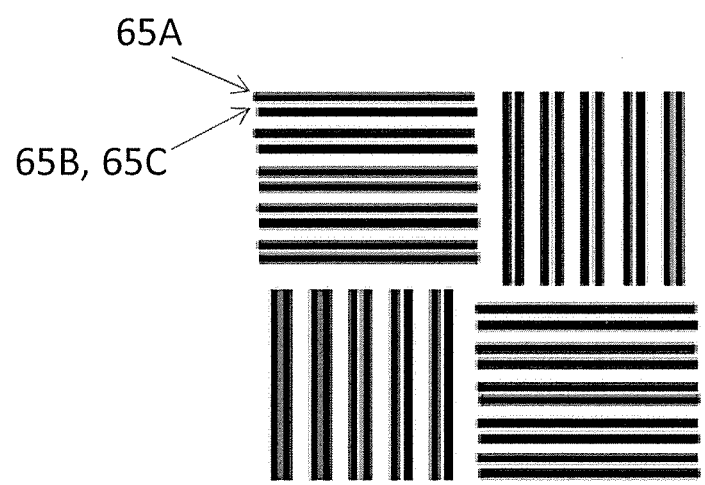

FIGS. 3A-3C show various examples of the first overlay measurement mark 65A, according to some embodiments. FIGS. 4A-4C show various examples of the first overlay measurement mark 65A overlaying a second overlay measurement mark 65B of an alignment model (e.g., a virtual mask to be described later) or a third overlay measurement mark 65C of a patterned photoresist layer.

Referring to FIGS. 3A and 4A, the first overlay measurement mark 65A and the second overlay measurement mark 65B of the alignment model or the third overlay measurement mark 65C of the patterned photoresist layer constitute a set of BIB (box in box) patterns.

Referring to FIGS. 3B and 4B, the first overlay measurement mark 65A and the second overlay measurement mark 65B of the alignment model or the third overlay measurement mark 65C of the patterned photoresist layer constitute a set of AIM (advanced imaging metrology) marks.

Referring to FIGS. 3C and 4C, the first overlay measurement mark 65A and the second overlay measurement mark 65B of the alignment model or the third overlay measurement mark 65C of the patterned photoresist layer constitute a set of μDBO (micro diffraction based overlay) marks.

According to some embodiments, pre-overlay measurement data or overlay measurement data indicate an alignment accuracy between centers the first overlay measurement mark 65A and the second overlay measurement mark 65B of the alignment model or the third overlay measurement mark 65C of the patterned photoresist layer, based on image-based or diffraction-based pattern recognition algorithm implemented in a metrology tool (e.g., a virtual alignment and pre-overlay measurement tool 120 or one or more elements of the virtual alignment and pre-overlay measurement tool 120 to be described later).

One of ordinary skill in the art should understand that FIGS. 3A-4C merely show examples of the structure overlay measurement marks, and any other suitable overlay measurement marks having different structures can also be used.

Referring back to FIG. 1, a second material layer 102 is disposed on the first patterned layer 101 in some embodiments. The second material layer 102 includes a semiconductor material layer (such as silicon layer or silicon germanium layer), a dielectric material (such as silicon oxide, silicon nitride or low k dielectric material layer) or a conductive material (such as a doped polysilicon layer, a copper layer, or an aluminum layer). In one embodiment, the first major pattern 61A of the first patterned layer 101 includes source and drain features and the second major pattern to be formed in the second material layer 102 includes contacts designed to land on the source and drain features. In another embodiment, the first major pattern 61A of the first patterned layer 101 includes a plurality of metal lines and the second major pattern to be formed in the second material layer 102 includes via features designed to land on the metal lines.

In alternative embodiments, the second major pattern to be formed can be as in double patterning to reduce a pitch of the first major patterns 61A. In this case, the second material layer 102 can be omitted.

In other embodiments, patterns formed in a photoresist layer coated on the first patterned layer 101 can be directly used, for example, as an ion implantation mask, without transferring the patterns in the photoresist layer to an underlying layer by an etching process performed to the underlying line. In this case, the underlining layer such as the second material layer 102 can be omitted.

In the following, the substrate is described to include the first patterned layer 101 and the unpatterned second material layer 102 with a planarized exterior surface as an example.

Figure 5A:
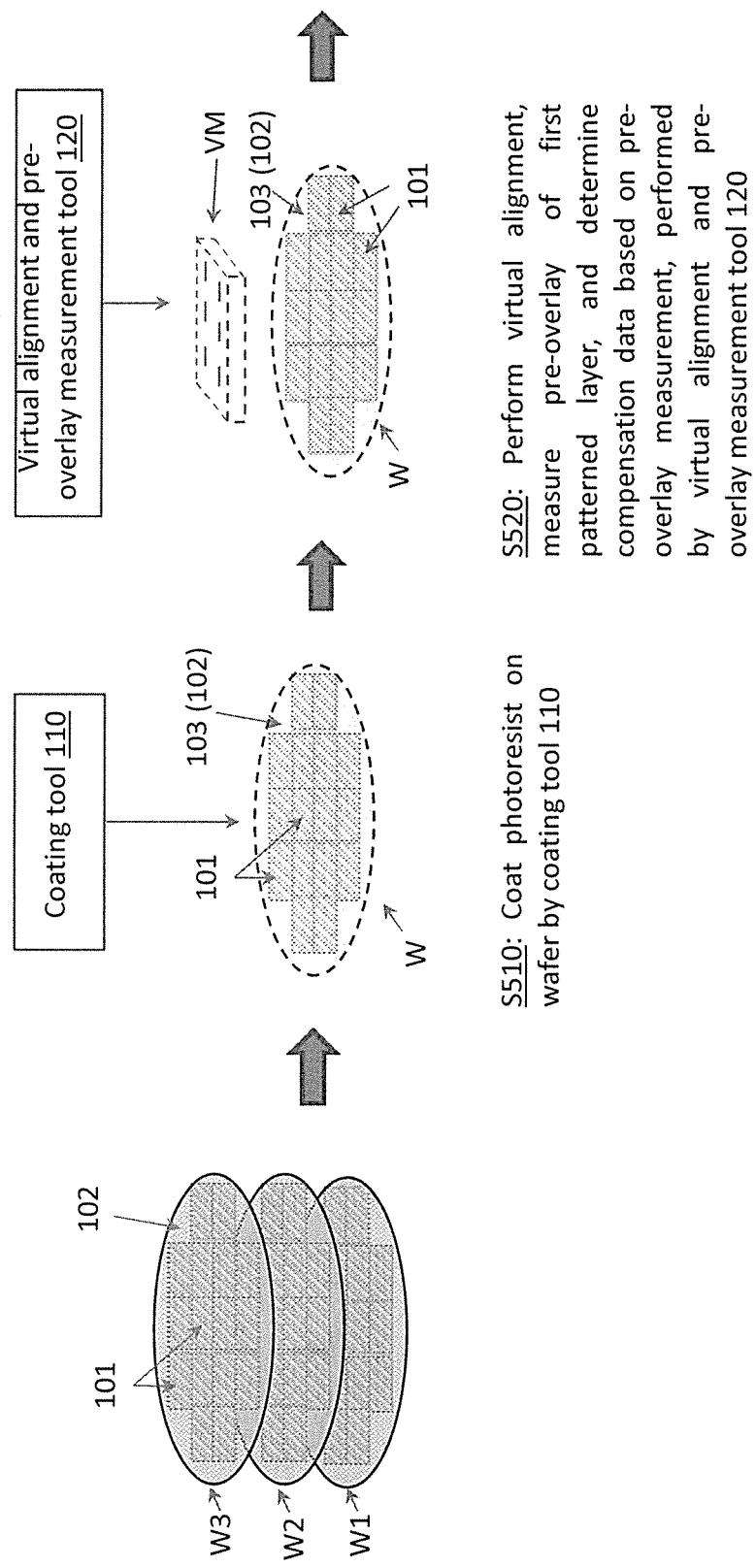
FIGS. 5A, 5B, and 5C show schematic views illustrating a method for manufacturing a semiconductor structure on a substrate according to some embodiments.
Figure 5B:
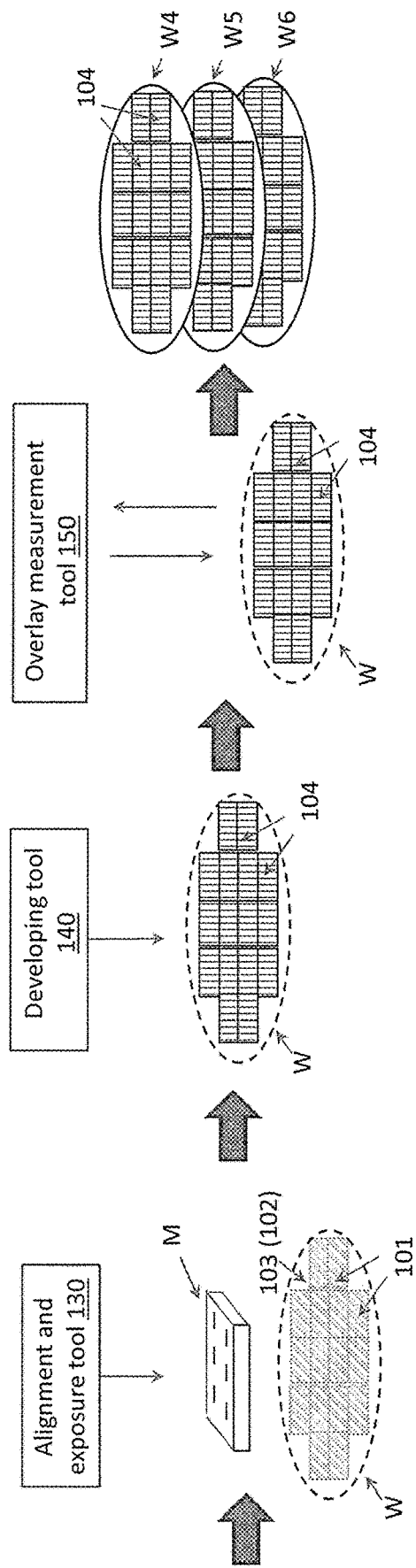
Figure 5C:
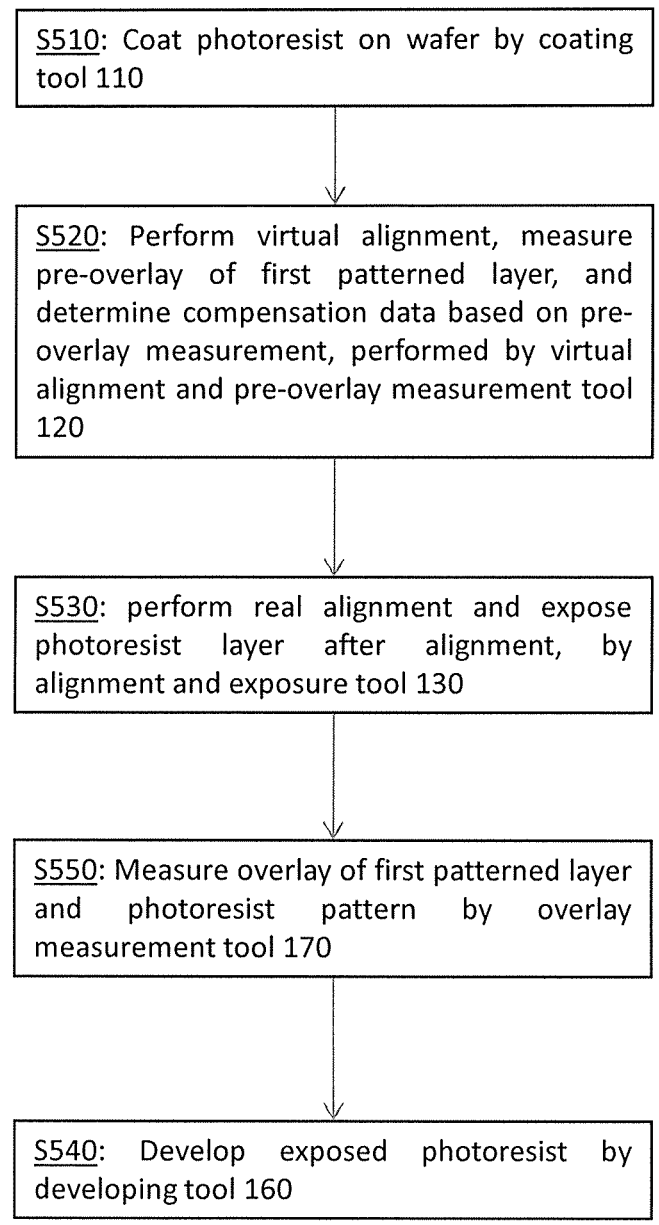

FIGS. 5A-5C show schematic views illustrating a method for manufacturing a semiconductor structure on a substrate.

Reference characters W1, W2, and W3 shown in FIG. 5A represent substrates, which can be the same as or similar to the aforementioned substrate W. In some embodiments, the substrates W1, W2, and W3 each have a first patterned layer 101 and a second material layer 102 disposed thereon, and the substrates W1, W2, and W3 are to be manufactured by the method according to some embodiments.

Each of the substrates W1, W2, and W3 is divided into multiple fields defined by solid boundary lines in the drawings. During a lithography patterning process to be described later, a photomask (also referred to as mask or reticle) is repeatedly transferred to each field of each substrate. Particularly, the lithography patterning process includes an exposing process in a proper mode, such as step and scan. The photomask is relatively stepped to a field of the substrate and the corresponding mask pattern is transferred to that field, and then the mask is stepped to a next field and the mask pattern is transferred to the field, and so on, until the fields of the substrate are exhausted. In some embodiments, each field includes one chip or alternatively multiple chips. In some embodiments, the alignment marks are formed on each field. For example, the alignment masks are formed on chip areas and the scribe lines. The number of the alignment marks and the positions of the alignment marks are designed to have sufficient coverage of the substrate from field to field and/or from chip to chip.

Reference character W shown in FIGS. 5A and 5B represents various states of a substrate having a first patterned layer 101 disposed thereon, being manufactured by the method according to some embodiments. One of ordinary skill in the art should understand that although only one substrate represented by reference character W is processed or manufactured through a plurality of stages/tools represented by reference numerals 110, 120, 130, 140, and 150, two or more substrates can be simultaneously, separately processed by different tools. As such, within one determined periods, more substrates can be manufactured by the method according to some embodiments. One of ordinary skill in the art should also understand that even one tool is illustrated in each process step, two or more tools having the same, or similar, functions can be used to simultaneously process two or more substrates in a process step which takes a relatively longer processing time than that used by a subsequent tool or a preceding tool. As such, the plurality of stages/tools can be effectively utilized to improve manufacturing efficiency.

Reference characters W4, W5, and W6 shown in FIG. 5B represent substrates having a patterned photoresist formed on a second material layer 102 aligned to the first patterned layer 101, after being manufactured by the method according to some embodiments.

Referring to the drawings, the method for manufacturing a semiconductor structure on a substrate starts with the substrate W on which the first patterned layer 101 and the second material layer 102 are sequentially disposed on. The method includes a step S510 in which a photoresist layer 103 is coated on the second material layer 102 by a proper technique, such as spin-on coating.

The photoresist layer 103 is sensitive to a radiation beam during a lithography exposing process and is resistive to a subsequent process (such as etching or ion implantation). In some embodiments, the photoresist layer 103 includes a polymeric material as a matrix that is resistive, radiation-sensitive component (such as photo-acid generator or PAG), and solvent. The photoresist layer 103 can be positive-tone resist or negative tone photoresist. The step S510 can further include other processing steps, such as a thermal baking step to reduce the solvent of the photoresist layer 103 after the spin-on coating.

The method for manufacturing a semiconductor structure on a substrate includes a step S520 in which a virtual alignment is performed, pre-overlay measurement is performed, and compensation data is determined by an alignment and pre-overlay measurement tool 120. Details of operations performed by and a configuration of the alignment and pre-overlay measurement tool 120 will be described with reference to FIG. 6.

Figure 6:
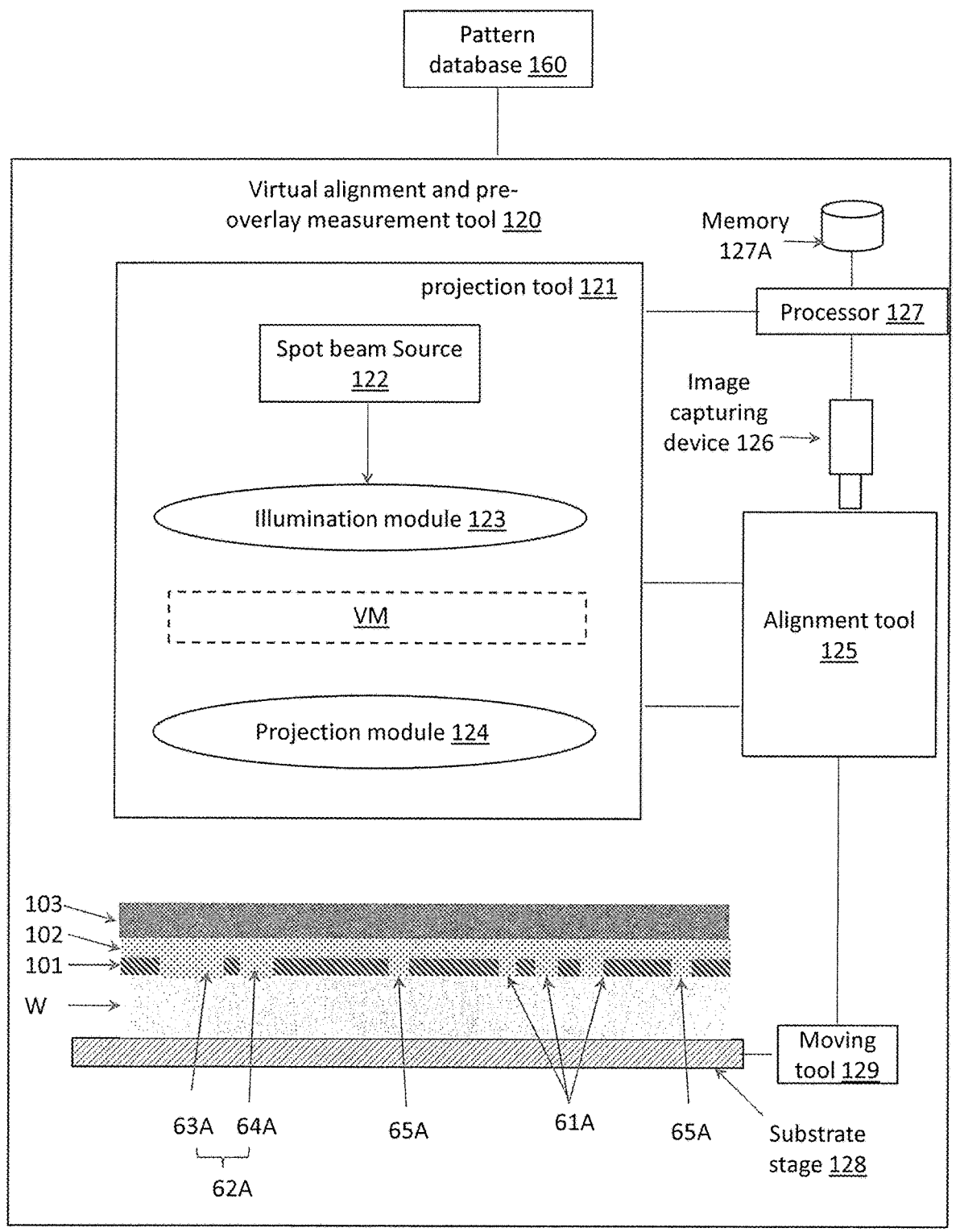
FIG. 6 shows a schematic view of an alignment and pre-overlay measurement tool according to some embodiments.

As shown in FIG. 6, the virtual alignment and pre-overlay measurement tool 120 includes a projection tool 121, an alignment tool 125, and an image capturing device 126, a processor 127, and a memory 127A in some embodiments.

The projection tool 121 is configured to generate a virtual mask VM. The virtual mask VM is not physically present and can be generated by a pattern caused by on/off operations of a spot beam source 122 or any other suitable light source in response to a control signal indicative of information of pattern data received from a pattern database 160, or any other suitable techniques. In some embodiments, the pattern database 160 stores the pattern data in a format such as a graphic data system (GDS or GDSII) and an open artwork system interchange standard (OASIS or OAS) proposed by Semiconductor Equipment and Materials International (SEMI). One of ordinary skill in the art should understand that the pattern data can be generated by one or more computer implemented with electronic design automation (EAD) software/tool and can be used to manufacture a photomask. Accordingly, a pattern in the photomask manufactured based on the pattern data includes information, such as location of the pattern and a property of the pattern, indicative of whether to keep or remove a photoresist material by a photolithography process with the photomask. The information of the pattern in the mask can be represented by a corresponding piece of information contained in the pattern data stored in the pattern database, and vice versa. That is, the virtual mask VM generated by the projection tool 121 based on the control signals from a controller such as the processor 127 of the virtual alignment and pre-overlay measurement tool 120 can mimic a real photomask or a portion of a real photomask to be used to pattern the photoresist layer 103.

The projection tool 121 includes an illumination module (e.g., a condenser) 123. The illumination module 123 includes a single lens or a lens module having multiple lenses and/or other lens components. For example, the illumination module 123 can include microlens arrays, shadow masks, and/or other structures designed to aid in directing incident light from the spot beam source 122 onto a projection module 124 of the projection tool 121. The projection module 124 can have a single lens element or a plurality of lens elements configured to direct light transmitted through the illumination module 123 onto the substrate W. Each lens element of the projection module 124 can include a transparent substrate and can further include a plurality of coating layers. The illumination module 122 and the projection module 123 are collectively referred to as an optical subsystem. The optical subsystem can further include additional components (not shown) such as an entrance pupil and an exit pupil.

In some embodiments, one or more from the spot beam source 122, the illumination module 123, the projection module 124, and the additional components of the projection tool 121, or a substrate stage 128 holding the substrate W can be provided with a respective position adjustment tool including, for example, motors or actuators, such that a respective element provided with the position adjustment tool can be moved in translational and rotational modes under a control by the alignment tool 125. A moving tool 129 shown in FIG. 5 is an example of the position adjustment tool to adjust the position of the substrate stage 128 such that relative positions of the virtual mask VM and the substrate W can be adjusted by the control of the alignment tool 125 during a process to perform alignment between the virtual mask VM and the substrate W.

In some embodiments, the virtual mask VM can perform scanning the substrate W in response to relative movement between the moving part 110 in a first scanning direction and perform stepping the substrate in a sub-scanning direction (for example, a direction perpendicular to the first scanning direction), such that the virtual pattern of the virtual mask VM can be projected onto the substrate W, mimicking an overlay phenomena of a patterned photoresist over the first patterned layer 101.

In some embodiments, the virtual alignment and pre-overlay measurement tool 120 can perform the alignment between the virtual mask VM and the substrate.

For example, the controller of the virtual alignment and pre-overlay measurement tool 120 generates, at least based on the pattern data received from the pattern database 160, a control signal indicative of position information of two or more coarse alignment marks of the virtual mask VM to be aligned to two or more coarse alignment marks 63A in the first patterned layer 101. In other embodiment, the virtual mask is also generated or adjusted based on the measurement result of a real photomask used in the lithography process. In response to the control signal, light representing location information of the two or more coarse alignment marks of the virtual mask VM is emitted from the virtual mask VM, and eventually projected onto a surface of the photoresist layer 103 disposed on the first patterned layer 101 after passing through the optical system of the projection tool 121 disposed between the spot beam source 122 and the substrate W. Accordingly, the two or more coarse alignment marks of the virtual mask VM appear on the photoresist layer 103.

The image capturing device 126 located over the alignment tool 140 captures an image of the current positions of the coarse alignment marks 63A in the first patterned layer 101 and the coarse alignment marks of the virtual mask VM projected onto the photoresist layer 103. The controller of the virtual alignment and pre-overlay measurement tool 120 determines, based on the captured image, the relative position and/or attitude associated with the overlay of the coarse alignment marks 63A in the first patterned layer 101 and the coarse alignment marks of the virtual mask VM projected onto the photoresist layer 103, generates an amount of compensation to reduce the relative position amount, and performs a subsequent alignment between the virtual mask VM and the substrate by controlling one or more position adjustment tools associated the units of the projection tool 121 and/or the substrate stage 128.

By repeating the above interactive operations among the image capturing device 126, the alignment tool 125, the projection tool 121 and the position adjustment tools thereof, the substrate stage 128, and the controller of the virtual alignment and pre-overlay measurement tool 120, a coarse alignment can be completed when the expected coarse alignment accuracy based on the coarse alignment marks is obtained.

Thereafter, a fine alignment can be performed. The process to perform the fine alignment is substantially the same as the coarse alignment except that the first fine alignment marks 64A in the first patterned layer 101 and the first fine alignment marks of the virtual mask VM projected onto the photoresist layer 103 are used rather than the coarse alignment marks 64A in the first patterned layer 101 and the first fine alignment marks of the virtual mask VM projected onto the photoresist layer 103. In addition, the image captured by the image capturing device 126 can be operated at a higher magnification mode for the fine alignment than previously used for the coarse alignment.

Figure 7:
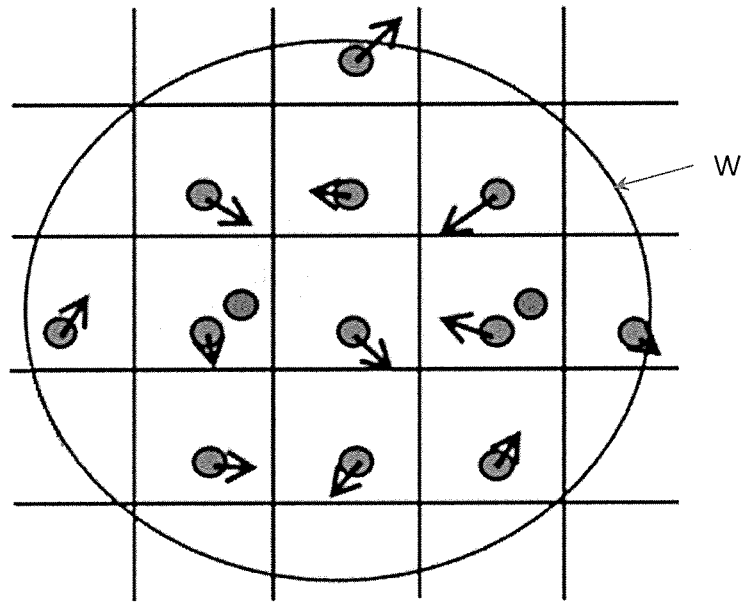
FIG. 7 shows a conceptive view illustrating locations of coarse and fine alignment marks and misalignment information in some embodiments.

FIG. 7 shows a conceptive view illustrating locations of the coarse and fine alignment marks and misalignment information. Arrows from the fine alignment marks indicate vectors of the misalignment measured at the locations of the fine alignment marks.

An amount of relative displacement or rotation and a direction thereof for the subsequent relative position adjustment between the virtual mask VM and the substrate W can be extracted based on an overall determination in consideration of all the location data shown in FIG. 7. Then another fine adjustment can be performed based on the determined relative displacement or rotation.

By repeating the interactive operations among the image capturing device 126, the alignment tool 125, the projection tool 121 and the position adjustment tools thereof, the substrate stage 128, and the controller of the virtual alignment and pre-overlay measurement tool 120, the fine alignment can be completed when the expected fine alignment accuracy based on the fine alignment marks is obtained.

After performing the alignment, an overlay measurement or an overlay mapping can be performed by the virtual alignment and pre-overlay measurement tool 120, so as to obtain overlay information of the virtual mask VM and the first patterned layer 101. Since no physical patterns are formed based on the virtual mask VM at the time of performing an overlay measurement or an overlay mapping, the overlay measurement or the overlay mapping will be described as pre-overlay measurement or pre-overlay mapping, to differ it from an overlay measurement or an overlay mapping of the patterned photoresist layer and the first patterned layer 101.

With reference to FIGS. 4A-4C, 5A, 5C, and 6, overlay data of the first patterned layer 101 can be collected by the virtual alignment and pre-overlay measurement tool 120. In some embodiments, the overlay data includes the locations of the first overlay measurement marks 65A or a map of the first overlay measurement marks 65A in the first patterned layer 101 with respect to the second overlay measurement marks 65B or a map of the second overlay measurement marks 65B provided by the virtual mask VM.

Figure 8:
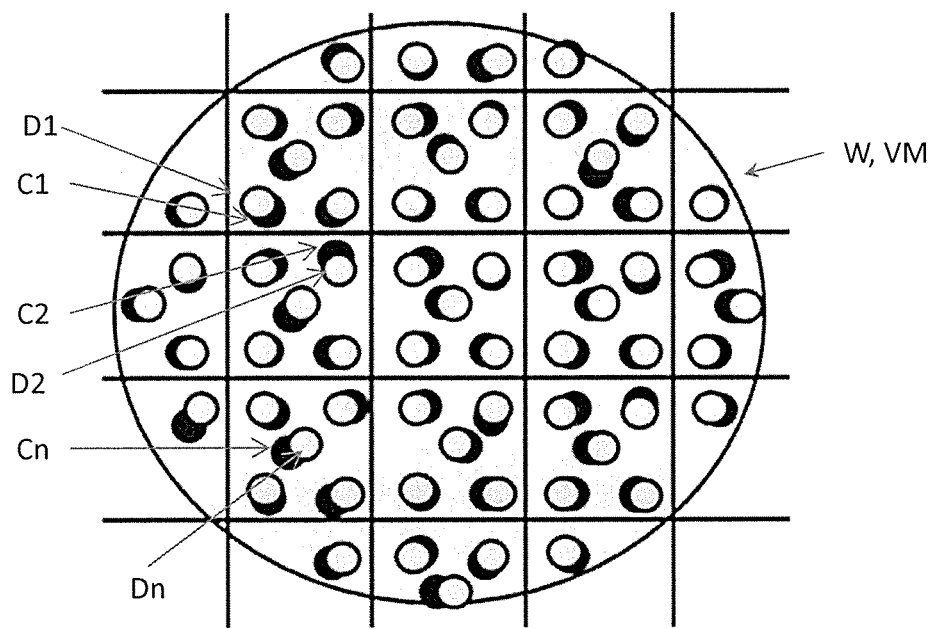
FIG. 8 shows an overlay mapping of first overlay measurement marks in a first patterned layer and second overlay measurement marks of a virtual mask projected onto a photoresist layer, during manufacturing a semiconductor device according to some embodiments.

FIG. 8 shows an overlay mapping of the first overlay measurement marks 65A in the first patterned layer 101 and the second overlay measurement marks 65B of the virtual mask VM projected onto the photoresist layer 103. $C1, C2, \ldots, Cn$ (n represents the number of all of the first overlay measurement marks 65A) denote centers of the first overlay marks 65A in the first patterned layer 101, and $D1, D2, \ldots, Dn$ denote centers of second overlay marks 65B of the virtual mask VM projected onto the photoresist layer 103. Here, $Ci$ ($i=1, 2, \ldots n$) and $Di$ are intended to completely overlay with each other, if the alignment is perfect and the overlay measurement contains no measurement error.

Comparing to FIGS. 7 and 8, the overlay data collected from the first overlay measurement marks 65A and the second overlay measurement marks 65B has a much great volume, as compared to the alignment data based on the fine alignment marks. Thus, the alignment data is different from the overlay data. The alignment data is designed for the purpose of alignment verification and the data volume is insufficient for overlay purpose.

In some embodiments, for a 12-in substrate W, the number of pairs of the overlay measurement marks 65A and 65B can be in a range between 10 to 80,000. In case in which the number of pairs of the overlay measurement marks 65A and 65B is between 10 to 80,000, measurement and data processing time will not be too long, an area in the substrate W used to make the overlay measurement marks is in a manufacturing tolerable range, and the overlay data can provide a reliable evaluation of the compensation used to real alignment. In a case in which the number of pairs of the overlay measurement marks 65A and 65B is less than 10, the pre-overlay data may not be sufficient to provide reliable evaluation of overlay of the virtual mask VM and the first patterned layer 101. On the other hand, in a case in which the number of pairs of the overlay measurement marks 65A and 65B is less than 80,000, measurement and data processing time and a relatively large area in the substrate may be wasted. In some embodiments, the number of pairs of the fine alignment marks 64A and 64B can be in a range between 10 to 200. However, the number of pairs of the overlay measurement marks is not particularly limited. In some embodiments, the number of pairs of the overlay measurement marks 65A and 65B can be modified in accordance with design particulars such as the size of the substrate and critical dimension of the patterns to be manufactured.

Referring to FIG. 8, the pre-overlay errors are evaluated or determined from the displacement differences between the first overlay measurement marks 65A of the first patterned layer 101 and the corresponding second overlay measurement marks 65B provided by the virtual mask VM. In some examples, each pre-overlay error is a vector including a magnitude and a direction. In some embodiments, correction algorithm including intra-field high order process correction (iHOPC), high order process correction (HOPC), and/or correction per exposure (CPE) can be applied to obtain the pre-overlay errors. The overlay errors are thus determined by a plurality of overlay errors corresponding to multiple pairs of the first and second overlay measurement marks 65A and 65B (or centers thereof). The pre-overlay errors provide a map of multiple overlay errors, forming a vector map.

In some embodiments, the virtual alignment and pre-overlay measurement tool 120 utilize an alignment model to determine overlay compensation that is associated to one or more system parameters (also referred to as compensation parameters) of the alignment and exposure tool 130 to be described later. The overlay compensation is operable to be applied to the alignment and exposure tool 130 such that the alignment and exposure tool 130 is adjusted accordingly, particularly the system parameter(s) being adjusted. In some embodiments, the position of the beam source 122, with which the virtual mask VM is aligned to the first patterned layer 101, can be used as a reference to be used to adjust the exposure light source in the alignment and exposure tool 130.

After the overlay compensation is applied to the alignment and exposure tool 130, the wafer W is loaded to the alignment and exposure tool 130. The alignment and exposure tool 130 includes a radiation source (or sources) 131 to provide radiation energy. The radiation source 131 can be any suitable light source. In various embodiments, the radiation source 131 can include a light source selected from the group consisting of ultraviolet (UV) source, deep UV (DUV) source, and EUV source. For example, the radiation source 131 can be a mercury lamp having a wavelength of 436 nm (G-line) or 365 nm (I-line), a Krypton Fluoride (KrF) excimer laser with wavelength of 248 nm, an Argon Fluoride (ArF) excimer laser with wavelength of 193 nm, a Fluoride ($F_2$) excimer laser with a wavelength of 157 nm, or other light sources having a desired wavelength (e.g., below approximately 100 nm). In another example, the radiation source 131 has a wavelength of about 13.5 nm or less. The alignment and exposure tool 130 includes an illumination module (e.g., a condenser) 132. The illumination module 132 includes a single lens or a lens module having multiple lenses and/or other lens components. For example, the illumination module 132 can include microlens arrays, shadow masks, and/or other structures designed to aid in directing incident light from the radiation source 131 onto a projection module 134 after transmitting through a photomask M disposed on a mask stage 133. The projection module 134 can have a single lens element or a plurality of lens elements configured to direct light onto the substrate W. Each lens element of the projection module 134 can include a transparent substrate and may further include a plurality of coating layers. The illumination module 132 and the projection module 134 are collectively referred to as an optical subsystem. The optical subsystem can further include additional components (not shown) such as an entrance pupil and an exit pupil.

In other embodiments, the radiation energy is EUV energy, and the photomask M and the optical subsystem are designed to have a reflective mechanism. In this situation, the optical subsystem includes various reflective components, such as mirrors, designed and configured to achieve the respective functions.

Here, the photomask M is manufactured by the same mask data used to generate the virtual mask VM, and thus, the projected patterns onto the exterior surface of the substrate W mimic the projected image of the photomask M on the exterior surface of the substrate W.

In some embodiments, the overlay compensation is associated to the optical subsystem (such as the projection module 134 shown in FIG. 9) and is applied to adjust the optical subsystem in order to eliminate or reduce the overlay errors during the subsequent exposing process. For example, the overlay compensation is applied to the projection module 134 such that the various optical components (such as lens or mirrors) are tuned with a configuration such that the imaging of the photomask pattern to the substrate W has decreased overlay errors. In one particular example, the compensation parameters are one or more optical parameters, such as one or more coefficients of the Zernike polynomial associated with the projection module 134.

Figure 9:
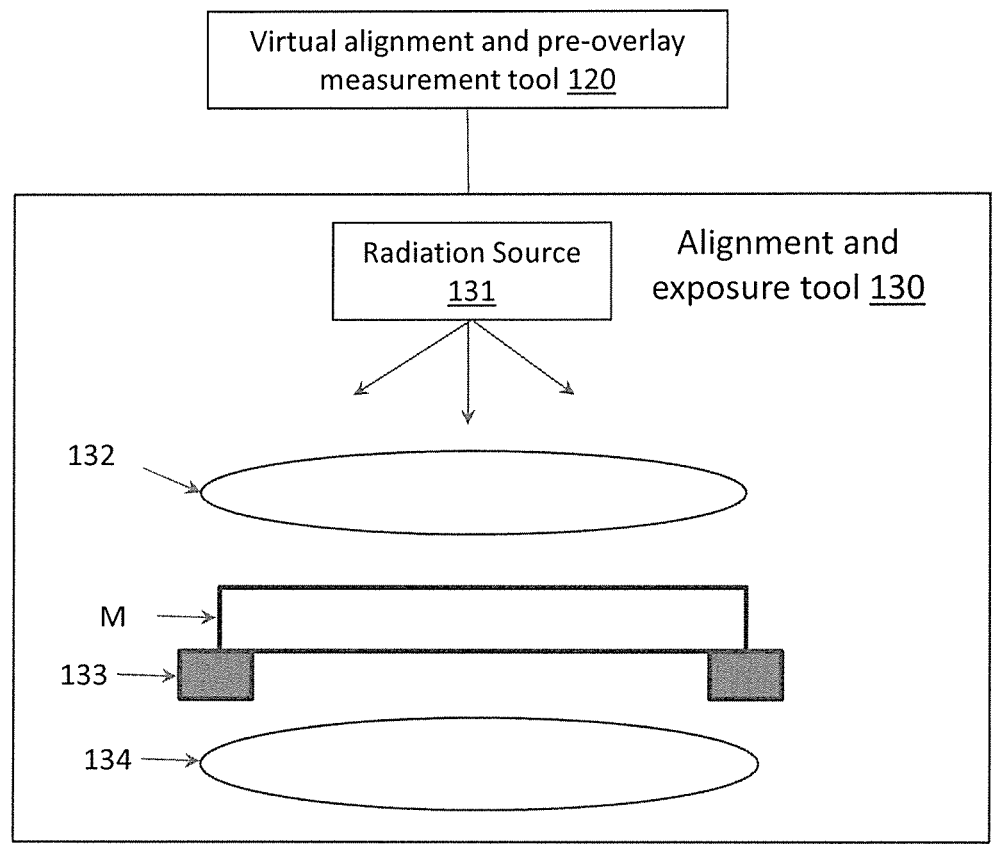
FIG. 9 shows a schematic view of an alignment and exposure tool according to some embodiments.
Figure 9:
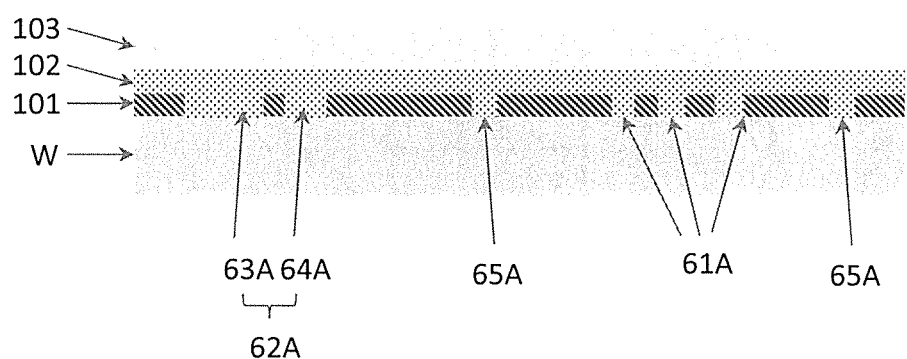

Referring to FIGS. 5B, 5C, and 9, in step S530, the alignment and exposure tool 130 performs a coarse alignment based on the third coarse alignment marks 63C in the photomask M and the first coarse alignment marks 63A in the first patterned layer 101, and then perform a fine alignment based on the third fine alignment marks 64C in the photomask M and the first fine alignment marks 64A in the first patterned layer 101. Even though an actual mask rather than a virtual mask is used in the step S30, detailed processes of the coarse and fine alignment can be referred to the description with reference to step S520 in FIGS. 5A, 5C, FIG. 6, and thus will be omitted here to avoid redundancy. One of ordinary skill in the art should understand that the alignment and exposure tool 130 may include additional elements included in the virtual alignment and pre-overlay measurement tool 120, and the descriptions thereof will be omitted to avoid redundancy.

In some embodiments, the virtual alignment and the collecting of the pre-overlay data of the first patterned layer 101 with respect to patterns on the substrate provided by the virtual mask VM is implemented in one or more standalone alignment and overlay metrology tool (an offline mode) such as the virtual alignment and pre-overlay measurement tool 120 shown in FIG. 6. The number of the alignment and overlay metrology tools to be used for the step S520 is determined based on the throughput of the step S20 and the throughput of an exposing process in step S530 to the first photoresist layer 103 by the actual alignment and exposure tool 130, in order to eliminate the waiting time of the actual alignment and exposure tool 130 to improve manufacturing efficiency, thereby reducing cost.

In some embodiments, such association between the alignment and exposing process by the actual alignment and exposure tool 130 and virtual alignment and pre-overlay measurement by the virtual alignment and pre-overlay measurement tool 120 is dynamic, depending on the individual recipes of the exposing process to individual products.

In some embodiments, the elements in the virtual alignment and pre-overlay measurement tool 120 that involve virtual alignment can be configured the same as the elements in the alignment and exposure tool 130 that perform actual alignment, without considering the difference of light source for illumination. As such, the compensation data determined based on the collected pre-overlay data is more reliable.

In some embodiments, the actual alignment and exposure tool 130 and the virtual alignment and pre-overlay measurement tool 120 can be an integrated system, and in such a case, the same elements can be used in the virtual alignment in the step S520 and the actual alignment in the step S530.

As the compensation based on the virtual alignment and pre-overlay measurement is applied to the actual alignment, the alignment accuracy can be improved from 20 nm to 10 nm or to 7 nm or even to 3-5 nm or less, as compared to an example in which no virtual alignment and pre-overlay measurement is performed to determine compensation.

As the compensation is based on the virtual alignment and pre-overlay measurement without actual exposure and development of the photoresist layer, only one exposure process is applied as compared to the example described with reference to FIG. 2, thereby reducing time used by the exposure unit which is one of the most expensive manufacturing tools, and lowering the manufacturing cost.

In some embodiments, the compensation applied to the alignment and exposure tool 130 used to align the substrate W can also be used to align subsequent wafers including one or more of the substrates W1, W2, and W3. In some embodiments, at the time of manufacturing the one or more of the substrates W1, W2, and W3 after the compensation being applied to the alignment and exposure tool 130, the step S520 can be omitted.

Now referring back to FIGS. 5A and 5C, the method according to some embodiments further includes a step S540 in which a developing process is performed to the photoresist layer 103 so as to form the patterned photoresist layer. For example, in a case in which the photoresist layer is a positive tone photoresist, the exposed portion of the photoresist layer 103 will be removed by the developing process. In another example, in case in which the photoresist layer 103 is a negative tone photoresist, the unexposed portion of the photoresist layer 103 will be removed by the developing process but the exposed portion remains. Therefore, by the developing process performed in step S540, the latent pattern of the exposed resist layer is converted to a patterned photoresist layer 103' (shown in FIG. 10) with various openings to uncover the underlying second material layer 102.

Figure 10:
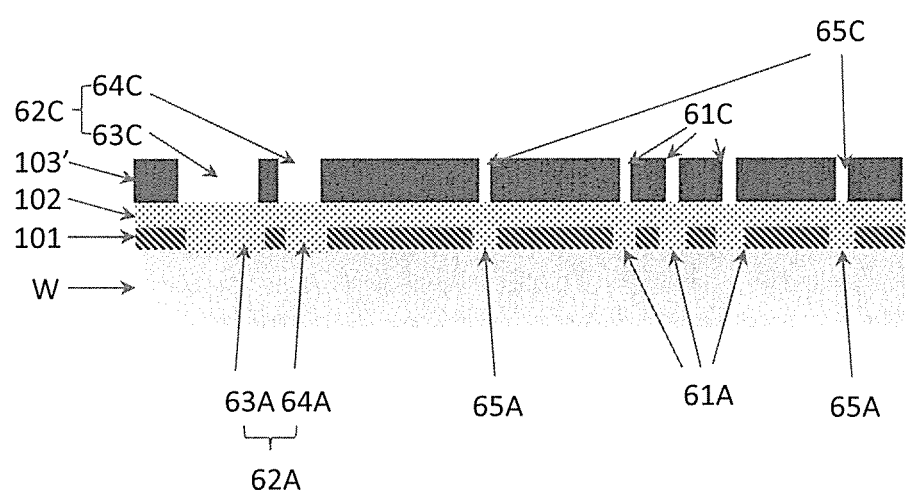
FIG. 10 shows a cross-sectional view of a patterned photoresist over a substrate, manufactured by a method according to some embodiments.

Referring to FIG. 10, the patterned photoresist layer 103' includes a third main pattern 61C, third alignment marks 62C including a third coarse alignment mark 63C and a third fine alignment mark 64C, and third overlay measurement marks 65C, corresponding to (i.e., aligned to) those in the first patterned layer 101.

Now with reference to FIGS. 5B, 5C, and 10, the method according to some embodiments further includes step S550 in which an overlay measurement is performed to obtain overlay data of the patterned photoresist layer 103' and the first patterned layer 101 by an overlay measurement tool 150. In some embodiments, the overlay data or overlap map is obtained by measuring the third overlay measurement marks 65C with respect to the first overlay measurement marks 65A. In some embodiments, the overlay measurement tool 150 can determine compensation data that can be applied to the alignment and exposure tool 130 used for a subsequent substrate. Operations and configurations of the overlay measurement tool 150 can be referred to the descriptions of the virtual alignment and pre-overlay measurement tool 120. In some embodiments, the overlay measurement tool 150 can be substantially the same as the virtual alignment and pre-overlay measurement tool 120 except that the elements or tools in the virtual alignment and pre-overlay measurement tool 120 for virtual alignment is omitted or not used. A description of the overlay measurement tool 150 thus will not be repeated to avoid redundancy. In some embodiments, the step S550 can be omitted.

Although not shown, the method according to some embodiments can further include steps to etch the uncovered second material layer 102 so as to transfer the patterns in the patterned photoresist layer 102 to the second material layer 102 and to remove the patterned photoresist layer 103' thereafter.

In some embodiments, the sequence of steps in the method can be adjusted. For example, step S510 to coat the photoresist layer 103 can be performed after step S520 but before actual alignment and exposure. In this case, at the time of performing virtual alignment and obtain pre-overlay mapping to determine compensation used in real alignment, no photoresist is coated on the second material layer 102.

Figure 11:
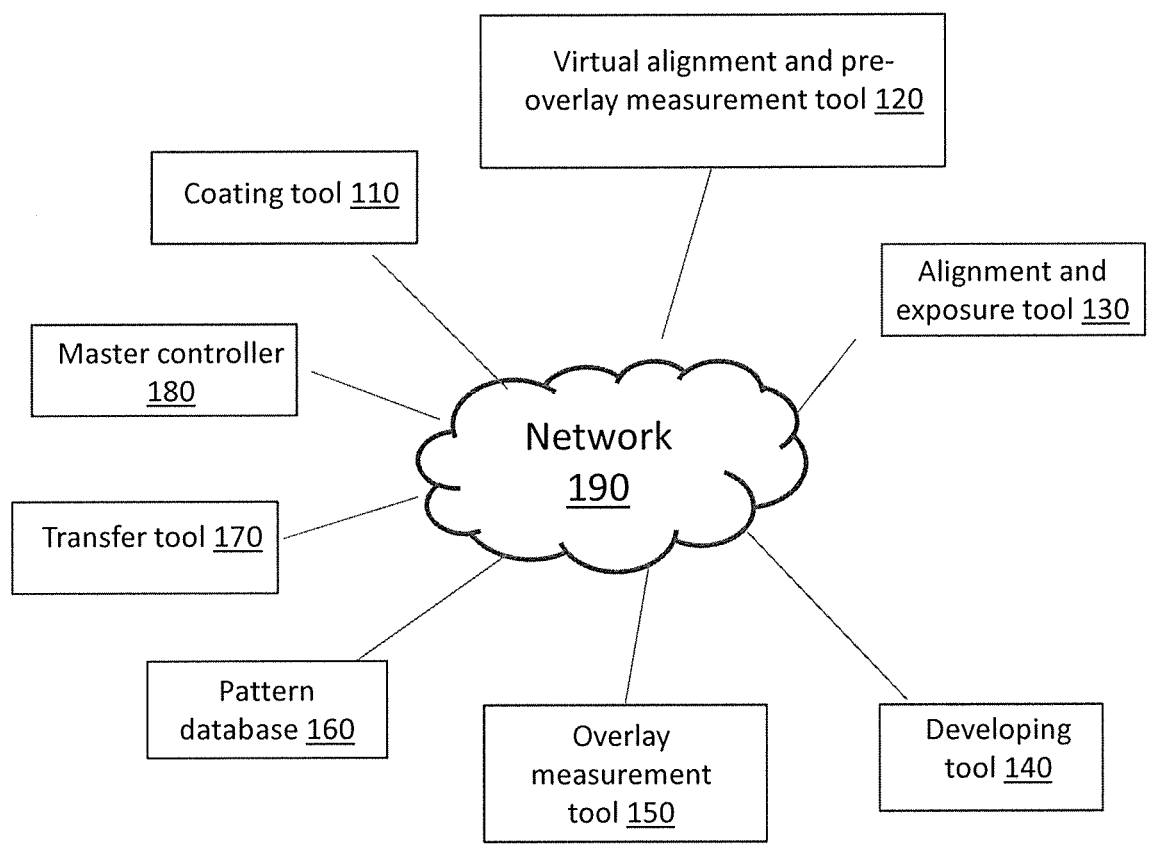
FIG. 11 shows a schematic diagram of a system to manufacture a structure on a substrate, according to some embodiments.

FIG. 11 shows schematic diagram of a system to manufacture a structure on a substrate, according to some embodiments.

As shown in FIG. 11, the system 100 includes a network 190, wired or wireless or combination thereof, connecting the aforementioned tools such as the coating tool 110, the virtual alignment and pre-overlay measurement tool 120, the alignment and exposure tool 130, the developing tool 140, the overlay measurement tool 150, and the pattern database 160. The system 100 can further include a transfer tool 170 such as a robot programmed to transport the substrate among the various tools or units and a master controller 180 connected to the network 190. The master controller 180 can control, monitor, and/or coordinate overall operations of the various tools or units connected to the network 190.

Any of the disclosed techniques such as measurement, alignment, determination, movement, image process, image/pattern recognition, and offset/misalignment extraction, tools, units, modules, controllers, steps, and/or operations can be implemented in whole or in part by software comprising computer-executable instructions stored on non-transitory computer-readable medium. Such software can be executed on one or more computers or one or more processors implemented in a tool or unit or in the master controller 180. For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language.

Any data produced from any of the disclosed steps or operations can be stored on computer-readable medium (e.g., tangible computer-readable medium, such as one or more CDs, volatile memory components (such as DRAM or SRAM), or nonvolatile or non-transitory memory components (such as hard drives)), non-transitory, using a variety of different data structures or formats. Such data can be created, updated, or stored using a local computer or over a network (e.g., by a server computer) such as the network 190, and can be exchanged among the computers, the semiconductor manufacturing tools, and the semiconductor metrology tools.

Any of the tools, units, or controllers can have a user interface to allow an operator to input or adjust parameters according to design particulars.

As described above, the substrate W is a semiconductor substrate such as a 12-inch wafer made of silicon. The present disclosure is not limited thereto.

In other embodiments, the technique based on obtaining pre-overlay measurement data to determine compensation used in real alignment to improve alignment accuracy in real alignment can be applied to a scanner for lithography process or applied to other tools such as an e-beam writer, a nano imprinter, a self-assembling machine which use other process to make patterns on a substrate.

According to some aspects of the present disclosure, an alignment accuracy of a patterned photoresist layer with respect to a fabricated patterned layer can be improved, without using an extra lithography process to an interim photoresist layer, thereby reducing time used by an exposure unit and lowering manufacturing cost.

According to some aspects of the present disclosure, a greater number of overlay measurement marks with smaller size, as compared to fine alignment marks, can be used to obtain pre-overlay mapping before actual lithography process and/or overlay mapping after actual lithography process, thereby improve reliability of compensation data applied to adjust one or more parameters in an alignment tool.

In one embodiments, a method for manufacturing a structure on a substrate includes projecting an image of a reference pattern onto a substrate having a first patterned layer, the first patterned layer including first alignment marks and first overlay measurement marks, and the reference pattern including second alignment marks and second overlay measurement marks, aligning, based on the first alignment marks and the second alignment marks, the first patterned layer to the image of the reference pattern, obtaining a pre-overlay mapping of the first overlay measurement marks and the second overlay measurement marks, and determining compensation data indicative of information of the pre-overlay mapping of the first overlay measurement marks and the second overlay measurement marks. In one embodiment, the method further includes adjusting, based on the compensation data, a parameter in a tool. In one embodiment, the tool is an alignment module in a lithography tool. In one embodiment, the method further includes coating a photoresist layer on the first patterned layer. In one embodiment, the method further includes after coating the photoresist layer, aligning a photomask to the first patterned layer, and after alignment the photomask to the first patterned layer, patterning the photoresist layer. In one embodiment, the parameter is applied in the alignment of the photomask to the first patterned layer. In one embodiment, the method further includes prior to pattering the photoresist layer, forming a second material layer between the first patterned layer and the photoresist layer, and after patterning the photoresist layer, etching the second material layer with the patterned photoresist layer as an etching mask. In one embodiment, the method further includes obtaining an overlay mapping of the first overlay measurement marks and third overlay measurement marks in the etched second material layer. In one embodiment, the method further includes determining another compensation data indicative of information of the overlay mapping of the first overlay measurement marks and the third overlay measurement marks. In one embodiment, the method further includes adjusting, based on the another compensation data, the parameter in the tool or another parameter in the tool. In one embodiment, the method further includes generating, based on pattern data, a signal indicative of locations of the second alignment marks, and in response to the generated signal, adjusting an optical system above the substrate to allow the image of the reference pattern projected onto the substrate and aligned to the first patterned layer. In one embodiment, the photomask is manufactured based on the pattern data. In one embodiment, the photoresist is coated prior to obtaining the pre-overlay mapping of the first overlay measurement marks and the second overlay measurement marks, and is exposed after obtaining the pre-overlay mapping of the first overlay measurement marks and the second overlay measurement marks. In one embodiment, the photoresist is coated after obtaining the pre-overlay mapping of the first overlay measurement marks and the second overlay measurement marks, and is exposed after obtaining the pre-overlay mapping of the first overlay measurement marks and the second overlay measurement marks. In one embodiment, the tool is one of an e-beam writer, a nano imprinter, or a self-assembling machine.

In one embodiment, a semiconductor manufacturing tool includes an alignment tool, an overlay measurement tool, a substrate stage on which a substrate having a patterned layer is disposed, a processor, and a non-transitory storage medium storing instructions, when executed, causing the processor to: transmit a signal to the alignment tool to cause the alignment tool to project an image of a reference pattern on the substrate, cause the alignment tool to perform alignment of the patterned layer to the projected image, based on first alignment marks in the patterned layer and second alignment marks provided by the projected image, cause the overlay measurement tool to obtain pre-overlay mapping of first overlay measurement marks in the patterned layer and second overlay measurement marks provided by the projected image, and determine compensation data indicative of information of the pre-overlay mapping of the first overlay measurement marks and the second overlay measurement marks. In one embodiment, the non-transitory storage medium storing instructions, when executed, further causes the processor to: transmit a signal indicating the compensation data to another semiconductor tool to cause the another semiconductor tool to adjust a parameter in response to the received signal. In one embodiment, the semiconductor manufacturing tool further includes an exposure tool, and the non-transitory storage medium storing instructions, when executed, further causes the processor to: adjust a parameter of the alignment tool, after adjusting the parameter of the alignment tool, cause the alignment tool to re-perform alignment of the patterned layer to the projected image, after re-performing the alignment, cause the exposure tool to expose a photoresist layer coated on the patterned layer.

In one embodiment, a semiconductor manufacturing system includes a virtual alignment and pre-overlay measurement tool configured to: project an image of a reference pattern onto the substrate, virtually align the first patterned layer to the projected image based on first alignment marks in the first patterned layer and second alignment marks provided by the projected image, obtain a pre-overlay mapping of the first overlay measurement marks and the second overlay measurement marks, and determine compensation data indicative of information of the pre-overlay mapping of the first overlay measurement marks and the second overlay measurement marks, an alignment and exposure tool configured to: align a photomask to the first patterned layer based on the compensation data and expose a photoresist layer coated on the first patterned layer, and an developing tool configured to develop the exposed photoresist layer. In one embodiment, among the virtual alignment and pre-overlay measurement tool and the alignment and exposure tool, only the alignment and exposure tool comprises a radiation source for exposing the photoresist layer.

The term "embodiment" or "embodiments" described above does not refer to the same embodiment or the same embodiments, and is provided to emphasize a particular feature or characteristic different from that of other embodiment or embodiments. One of ordinary skill in the art should understand that "embodiment" or "embodiments" described above can be considered to be able to be implemented by being combined in whole or in part with one another, unless an opposite or contradictory description is provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a structure on a substrate, the method comprising:
projecting an image of a reference pattern onto a substrate having a first patterned layer, the first patterned layer including first alignment marks and first overlay measurement marks, and the reference pattern including second alignment marks and second overlay measurement marks;
aligning, based on the first alignment marks and the second alignment marks, the first patterned layer to the image of the reference pattern;
obtaining a pre-overlay mapping of the first overlay measurement marks and the second overlay measurement marks; and
determining compensation data indicative of information of the pre-overlay mapping of the first overlay measurement marks and the second overlay measurement marks.

2. The method of claim 1, further comprising adjusting, based on the compensation data, a parameter in a tool.

3. The method of claim 2, wherein the tool is an alignment module in a lithography tool.

4. The method of claim 2, further comprising coating a photoresist layer on the first patterned layer.

5. The method of claim 4, further comprising:
after coating the photoresist layer, aligning a photomask to the first patterned layer; and
after aligning the photomask to the first patterned layer, patterning the photoresist layer.

6. The method of claim 5, wherein the parameter is applied in the alignment of the photomask to the first patterned layer.

7. The method of claim 5, further comprising:
prior to patterning the photoresist layer, forming a second material layer between the first patterned layer and the photoresist layer; and
after patterning the photoresist layer, etching the second material layer with the patterned photoresist layer as an etching mask.

8. The method of claim 7, further comprising obtaining an overlay mapping of the first overlay measurement marks and third overlay measurement marks in the etched second material layer.

9. The method of claim 8, further comprising determining another compensation data indicative of information of the overlay mapping of the first overlay measurement marks and the third overlay measurement marks.

10. The method of claim 9, further comprising adjusting, based on the another compensation data, the parameter in the tool or another parameter in the tool.

11. The method of claim 5, further comprising:
generating, based on pattern data, a signal indicative of locations of the second alignment marks, and
in response to the generated signal, adjusting an optical system above the substrate to allow the image of the reference pattern projected onto the substrate to be aligned to the first patterned layer.

12. The method of claim 11, wherein the photomask is manufactured based on the pattern data.

13. The method of claim 4, wherein the photoresist is coated prior to obtaining the pre-overlay mapping of the first overlay measurement marks and the second overlay measurement marks, and is exposed after obtaining the pre-overlay mapping of the first overlay measurement marks and the second overlay measurement marks.

14. The method of claim 4, wherein the photoresist is coated after obtaining the pre-overlay mapping of the first overlay measurement marks and the second overlay measurement marks, and is exposed after obtaining the pre-overlay mapping of the first overlay measurement marks and the second overlay measurement marks.

15. The method of claim 2, wherein the tool is one of an e-beam writer, a nano imprinter, or a self-assembling machine.

16. A method for manufacturing a semiconductor device, comprising:
projecting an image of a reference pattern onto a substrate, virtually aligning a first patterned layer to the projected image based on first alignment marks in the first patterned layer and second alignment marks provided by the projected image, obtaining a pre-overlay mapping of the first overlay measurement marks and the second overlay measurement marks;

determining compensation data indicative of information of the pre-overlay mapping of the first overlay measurement marks and the second overlay measurement marks;

aligning a virtual photomask to the first patterned layer based on the compensation data;

exposing a photoresist layer coated on the first patterned layer; and developing the exposed photoresist layer.

17. The method according to claim 16, wherein two or more coarse alignment marks of the virtual mask are projected onto a surface of the photoresist layer.

18. The method according to claim 17, further comprising:

capturing an image of coarse alignment marks in the photoresist layer and the two or more coarse alignment marks of the virtual mask projected onto the surface of the photoresist layer; and determining the relative positions of the coarse alignment marks in the photoresist layer and the coarse alignment marks of the virtual mask projected onto the surface of the photoresist layer to generate the compensation data.

19. A method for manufacturing a semiconductor device, comprising:

forming a photoresist layer over a pattern on a substrate;

virtually aligning a projected image having projected alignment marks with first alignment marks in the pattern on the substrate;

measuring a pre-overlay of projected alignment marks and the first alignment marks;

determining compensation data based on the measuring a pre-overlay;

aligning a mask over the photoresist layer based on the compensation data;

exposing the photoresist layer using the mask, after the aligning the mask;

developing the exposed photoresist layer to form a patterned photoresist layer; and measuring the overlay of the patterned photoresist layer and the pattern on the substrate.

20. The method according to claim 19, wherein the mask is a virtual mask.

* * * * *